(12) United States Patent
Sampath

(10) Patent No.: US 6,400,160 B1
(45) Date of Patent: Jun. 4, 2002

(54) METHOD AND APPARATUS FOR MUTUAL IMPEDANCE COUPLING FOR COMPONENT LEVEL EMI MEASUREMENTS

(75) Inventor: Komarapalayam Velayudham Karikalan Sampath, Singapore (SG)

(73) Assignee: Advanced Micro Devices, Inc., Sunnyvale, CA (US)

(*) Notice: Subject to any disclaimer, the term of this patent is extended or adjusted under 35 U.S.C. 154(b) by 105 days.

(21) Appl. No.: 09/598,461

(22) Filed: Jun. 22, 2000

(51) Int. Cl.[7] .............................................. G01R 31/26
(52) U.S. Cl. ....................... 324/613; 324/627; 324/750; 324/765
(58) Field of Search ................................ 324/613, 627, 324/628, 765, 750, 763

(56) References Cited

U.S. PATENT DOCUMENTS 5,689,192 A * 11/1997 Rogers ........................ 324/627
6,281,697 B1 * 8/2001 Masuda et al. ............. 324/765

* cited by examiner

*Primary Examiner*—N. Le
*Assistant Examiner*—T. R. Sundaram

(57) ABSTRACT

A method and apparatus for determining EMI compliance provides a conductor that is mutually impedance coupled to an integrated circuit on a semiconductor package. The conductor is attached to a lid covering the integrated circuit and RF noise energy on the lid is mutually impedance coupled to the conductor. By measuring the voltage at the conductor, an indirect measurement of the EMI generated by the integrated circuit is made.

20 Claims, 6 Drawing Sheets

METHOD AND APPARATUS FOR MUTUAL IMPEDANCE COUPLING FOR COMPONENT LEVEL EMI MEASUREMENTS

FIELD OF THE INVENTION

The present invention relates to electromagnetic interference measurements (EMI) of digital systems and, more particularly, to determining electromagnetic compatibility (EMC) of integrated circuits (ICs).

BACKGROUND OF THE INVENTION

Electromagnetic radiation emitted from a digital system is mainly at the fundamental frequency of its swiching operation and that frequency's harmonics; for systems with multiple clocks, multiple fundamental frequencies and harmonics will be present. At other frequencies, system radiation levels are typically undetectable.

International as well as national regulatory standards exist which specify allowable levels of EMI emissions from unintentional radiators. The main purpose of these standards is to protect the radio frequency spectrum for equipment licensed to operate at appropriate frequencies. Because the regulated frequencies reach into the gigahertz range and the allowable signal levels are typically in the microvolt range, the test set-up when measuring EMI often influences the test results. Therefore, in addition to allowable signal levels, these regulations also specify measuring methods in an attempt to standardize the compliance tests and improve their repeatability. These factors increase both the length and cost of typical EMI tests.

Typically, EMI regulations directly apply only to full systems, such as a personal computer, and not directly to system components, such as video cards or microprocessors. An accepted industry practice, however, to test the EMC of system components is to use the "substitution method". In this method, a compliant system is used, and an original component is replaced with a new component. If the system is still compliant, then the new component is determined to be electromagnetically compatible.

Because the microprocesor is one of the major contributors to system level EMI, EMC assessment of microprocessors is a concern of CPU manufacturers. This assessment encompasses two facets: verification of compliance to EMC standards and component characterization. When performing the substitution method to verify EMC compliance, multiple tests of multiple components on multiple systems are needed to provide any degree of confidence in the test results. Component characterization, the other facet of EMC assessment, identifies the effects that design choices have on EMI emissions. For purposes of characterization, a high number of package design options (e.g., package layer stack-up, chip-cap configuration, etc.) are evaluated and compared to arrive at valid manufacturing decisions.

One common feature of both facets is the large number of tests which need to be performed in order to properly assess a microprocessor's EMC. The far-field tests typically used for radiated emission measurements are both time consuming and expensive and the component industry needs an alternative method to perform EMC assessment. The Society of Automotive Engineers in developing their standard SAE J1752-1, entitled "EMC Measurement Procedures for Integrated Circuits", has investigated using near field EMI measurement methods for ICs; but these methods typically involve specially manufactured test boards attached to a modified Transverse Electromagnetic Mode (TEM) cell and introduce measurement errors when operated above one gigahertz. Presently, an alternative EMC assessment method and arrangement is needed, which produces EMI data corresponding to a microprocessor or other IC with minimum influence from other components such as cables, power supplies, and which allows testing of multiple parts in a timely and economic manner.

SUMMARY OF THE INVENTION

The present invention addresses the need for alternative EMI measurement methods and arrangements for digital electronic systems, especially alternatives to far-field measurement requirements as described in regulatory standards on EMI.

This, as well as other needs, are met by the present invention which uses the RF noise voltage present on an IC package lid to determine the likely far-field EMI behavior of that IC during system testing. In particular, the voltage resulting from mutual impedance coupling of a conductor with the package lid is used to assess the EMC of the IC. The present invention produces stable and repeatable measurement data in the frequency ranges of typical electronic system emissions. Further, it produces data which, while representative of the EMI contribution of the IC, also correlates well with the far-field system test behavior of the IC.

The needs are also met by embodiments of the invention which provide a determination of EMI compliance of a system by first operating a replaceable IC component at an operating speed, measuring the noise voltage level on the lid of the IC and then calculating a system level EMI valve based on the measured noise level.

The needs are further met by embodiments of the invention which provide a test apparatus for measuring the voltage potential on a lid of an IC comprising the IC attached to the IC so that it is mutually impedance coupled with the lid and a meter connected to the conductor to measure the voltage potential.

The foregoing features, as well as other aspects and advantages, of the present invention will become more apparent from the following detailed description, claims and drawings.

BRIEF DESCRIPTION OF THE DRAWINGS

FIG. 3 illustrates a schematic depiction of the test set-up depicted in FIG. 2a.

DETAILED DESCRIPTION OF THE INVENTION

An embodiment of the present invention is presented below specifically in terms of a CPU or microprocessor within a computer system. However, the scope of the present invention also includes similar ICs and systems other than this specific embodiment.

Figure 1:
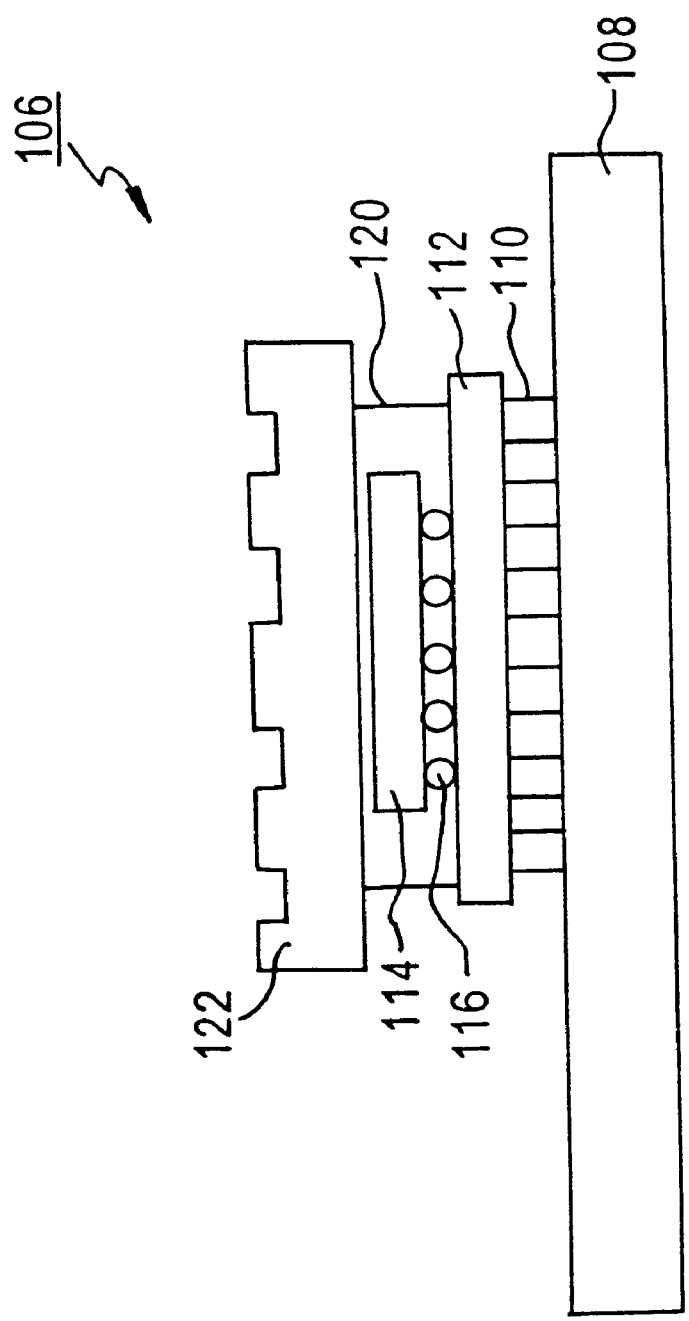
FIG. 1 illustrates a typical IC package for which the present invention performs EMI measurements

A typical CPU device 106 as depicted in FIG. 1 includes pins 110, or other connectors, for electrically coupling the device 106 to a motherboard 108, or other circuit board. The device 106 also includes package substrate 112, die 114, and solder bumps, pads or pins 116 for connecting die 114 and conducting traces (not shown) on substrate 112. The lid 120 seals and protects die 114 and its connections 116 to substrate 112 and provides a mounting surface for heat sink 122. The region between a lid 120 and substrate 112 may be filled with a resin or similar material for both its protective and thermal properties. FIG. 1 is only an exemplary IC; the present invention is not limited to the particular flip-chip arrangement depicted therein, other IC package types as known in the art are also contemplated within its scope.

Substrate 112 and connectors 110 are sometimes referred to as an IC package. For EMI measurement purposes, an IC package is basically a passive structure and the EM radiation depends on the harmonic contents of the currents that are flowing in it. The "package plus die" combination of a microprocessor contributes to the EMI performance of a computer system in the following two ways: direct radiation from the die and package through the heat sink assembly; and noise introduction into the supply and ground planes and the resulting radiation of this noise from the motherboard PCB traces and power cable.

At frequencies other than the core and I/O clocks and their harmonics, the influence of the microprocessor on the overall system EMI performance is negligible.

Far-field measurements of system EMI emissions which are used to compare CPU designs or perform EMC verifications are both costly and time consuming because of the testing equipment, set-up and procedures needed to acquire reproducible measurements. These disadvantages are only compounded when many measurements are required to obtain meaningful data.

One aspect of the present invention provides a novel method to measure the EMI emitted by the IC device. The RF noise voltage available on the lid 120 covering the CPU device 106, measured with respect to the system's ground, is used as a measure of the CPU's emitted EMI. There are a number of justifications for using the lid 120 in this manner. First, the lid 120 of the CPU device 106 acts as a closely and precisely positioned sensor which capacitively couples the radio frequency (RF) energy from the die 114 and package, while remaining insulated from the die 114 and package. Also, because the energy at the lid 120 is what is coupled to the heat sink 122 and ultimately radiated, the voltage difference between the lid 120 and ground is a good indicator of the "die and package" radiation for a given motherboard, while considerably isolating the contribution of other sub-systems like the power supply and VGA cards. Third, the precise positioning of the lid 120 on each CPU device 106, as compared to a near-field probe introduced during testing, allows more stable and reproducible data. Also, the manufacturing tolerances of dies, and thus the transmission lines within a package, are very precise. Therefore, any change in the RF potential signature on the lids 120 for CPU devices 106 with various package design options, are mainly attributable to changes in package design.

One method of measuring the lid's RF potential with respect to ground is a direct measurment in which the center conductor of one end of a coaxial cable is soldered to the lid and the outer conductor is soldered to the nearest ground. The other end of the cable is then connected to a spectrum analyzer. Although feasible, this method presents the difficulties of soldering to aluminum lids (which are common on many CPUs), choosing a common lid location to solder to, keeping the open-end ground length as short as possible, and soldering and desoldering the cable to each device under test.

Figure 2A:
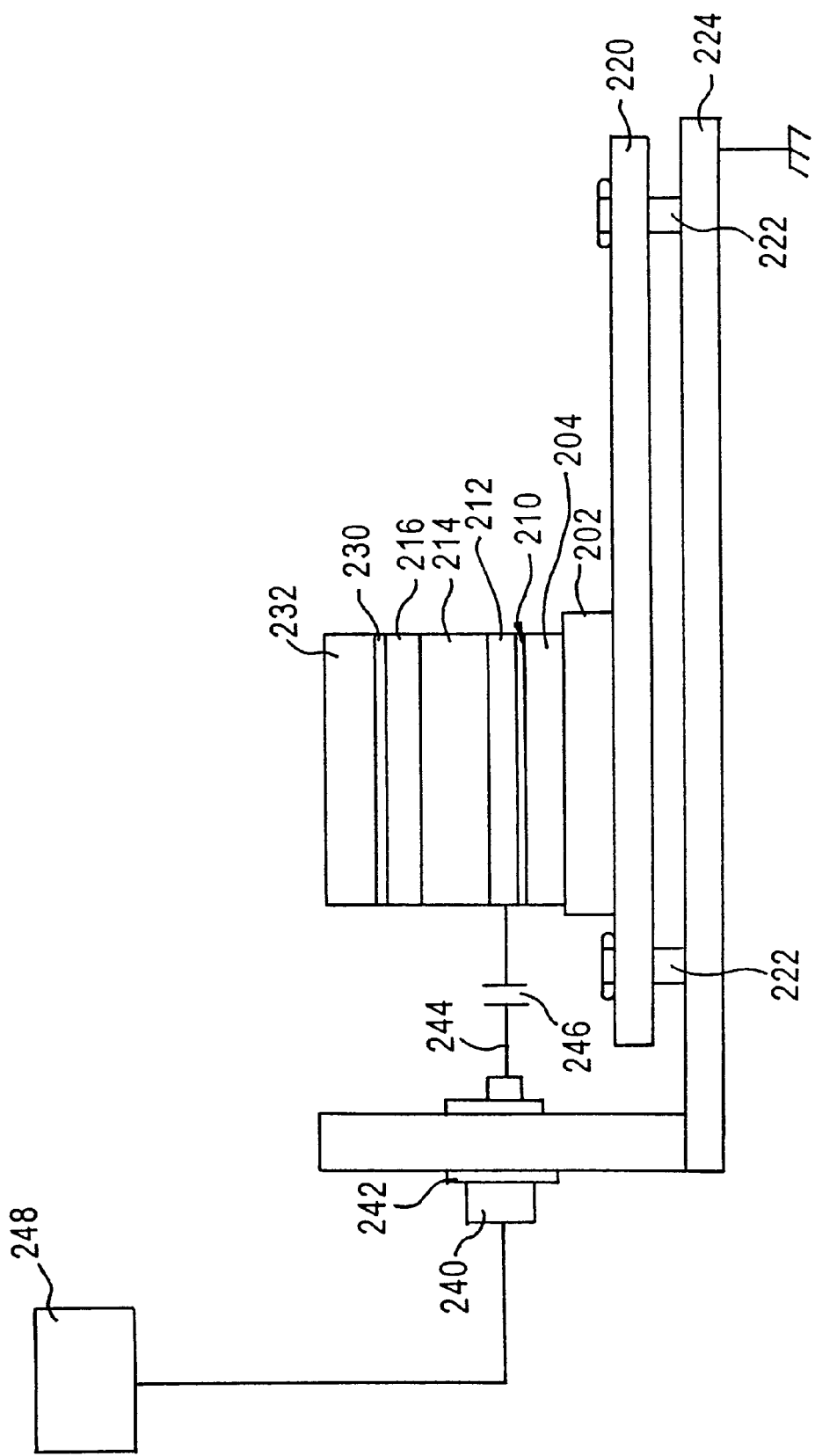
FIGS. 2a through 2c illustrate different test system set-ups in accordance with embodiments of the present invention.

FIG. 2a illustrates an exemplary embodiment in accordance with the present invention for indirectly measuring the RF voltage available on an IC's lid. Instead of directly measuring the lid potential, the set-up depicted in FIG. 2a allows coupling, through mutual impedance coupling, of the RF noise voltage from a lid 210 to a connected conductor 212. In this arrangement the lid 210 and conductor 212 are both inductively and capacitively coupled (i.e. mutually impedance coupled) and the coupled energy indicates the noise that would have been coupled to the heat sink in a similar manner.

In the mutual impedance coupling (MIC) measurement set-up of FIG. 2a, a motherboard 220 is supported by spacers 222 and has its '0 volts' connected through metal reference plane 224 to ground. This arrangement simulates the presence of a typical PC chassis. Socket 202 accepts a CPU or other IC 204 which has a lid 210 physically adjacent to a conductor 212. There are many known methods of securing heat sinks to microprocessors including various clips, clamps and adhesives. The present invention uses similar methods to secure the lid 210 and conductor 212 as well as to secure conductor 212, heat sink 214 and fan 216. Alternative connection methods include adding a weight 232 on top of heat sink 214 to operatively, but temporarily, connect the lid 210, conductor 212 and heat sink 214. In this alternative, a brass grille 230 is interposed to help isolate weight 232 from the fan 216.

In certain embodiments, conductor 212 is constructed of copper and has substantially the same dimensions as CPU 204. As for the thickness and other dimensions such as the side lengths, conductor 212 is preferably smaller compared to the wavelength of the highest frequency being measured; otherwise, the coupled noise voltage may vary depending on the location of the measurement of the conductor 212. In certain embodiments of the present invention, the conductor 212 is shaped to fit the shape of lid 210 to better facilitate coupling of the RF potential and to assist with heat dissipation.

A coaxial connector 240 provides connection between a spectrum analyzer 248 and the conductor 212. The outer conductor 242 of the connector 240 is electrically connected to the metal reference plane 224. The inner conductor 244 of connector 240 is connected through a DC blocking capacitor 246 to conductor 212. The connections between conductor 212, capacitor 246 and connector 240 are accomplished using conventional soldering methods.

Figure 2B:
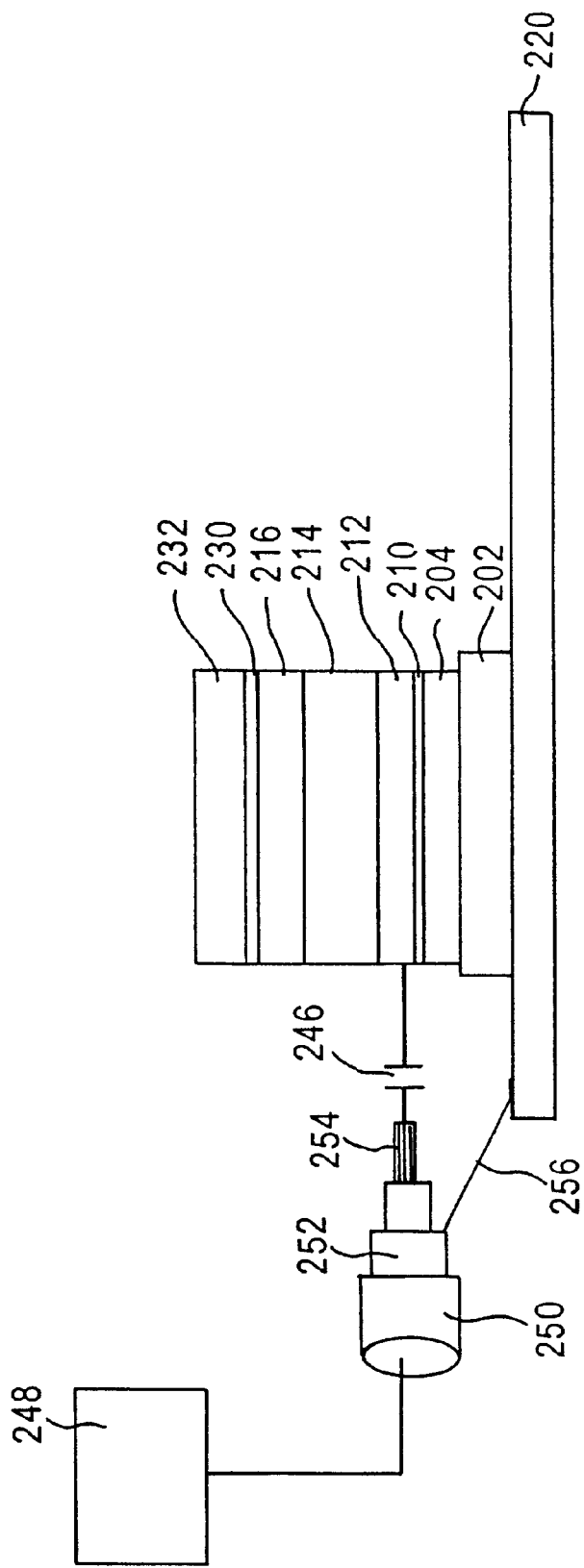

FIG. 2b illustrates another test set-up embodiment of the present invention. In this arrangement, coaxial cable 250 is used to connect conductor 212 to spectrum analyzer 248. Specifically, the outer conductor 252 of cable 250 is electrically connected to '0 volts' of the motherboard 220 and the inner conductor 254 is connected through the blocking capacitor 246 to conductor 212.

Figure 2C:
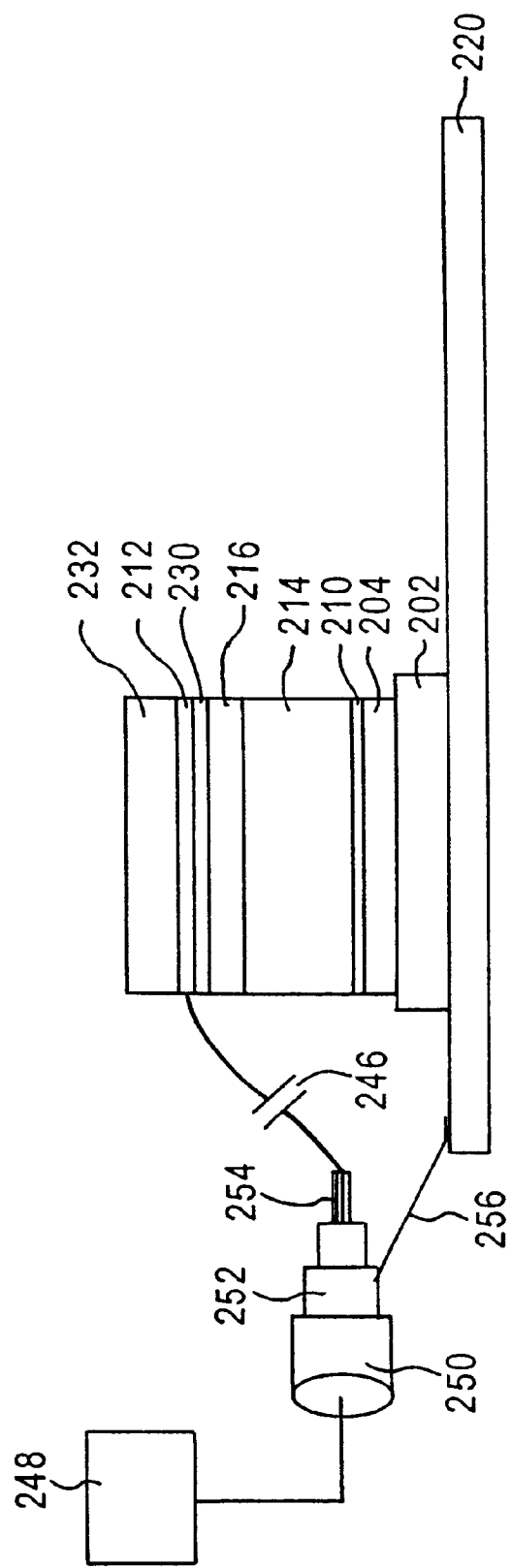

FIG. 2c illustrates another test set-up embodiment which positions conductor 212 differently than the previous two figures. In this drawing, the conductor 212 is inserted between the weight 232 and brass grille 230 instead of being physically adjacent to lid 210. The spectrum analyzer 248 still measures the voltage potential mutually impedance coupled to conductor 212 which, even in this arrangement, remains an indication of the RF noise energy on the lid 210.

In testing operation of the present invention, the RF energy at lid 210 is coupled to conductor 212, through mutual impedance coupling, and measured by a spectrum analyzer or other meter connected through connector 240 or coaxial cable 250.

Figure 3:
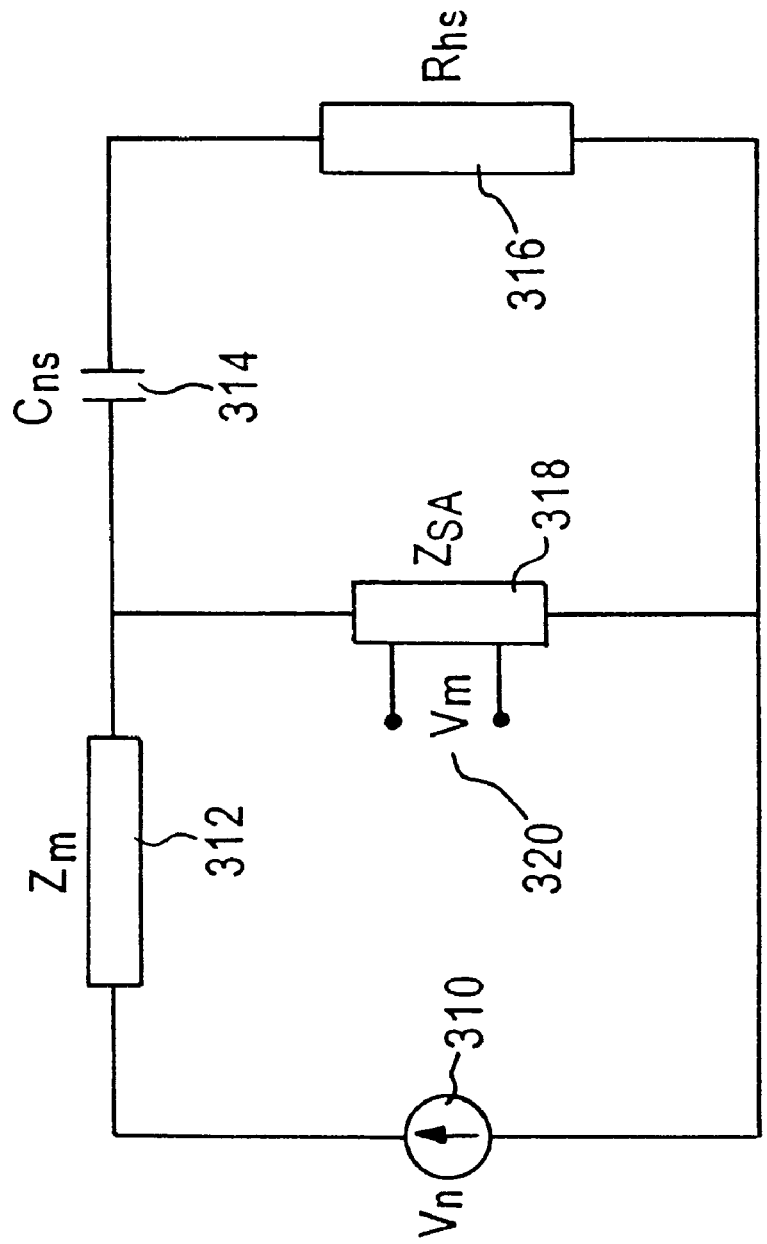

FIG. 3 depicts an equivalent circuit of the test set-up of FIG. 2a. In this figure, $V_n$ 310 is the noise voltage available on the package lid (FIG. 2a, 210). $Z_m$ 312 is the mutual impedance between the conductor (FIG. 2a, 212) and the lid 210. $Z_{SA}$ 318 is the input impedance of the spectrum analyzer and $V_m$ 320. is the measured voltage at the spectrum analyzer. $C_{hs}$ 314 and $R_{hs}$ 316 are, respectively, the capacitance between the conductor 212 and the heat sink (FIG. 2a, 214) and the frequency-sensitive radiation resistance of the heat sink 214.

In theory, the radiated energy from a device is obtained by adding (in logarithmic terms, in the frequency domain) the frequency spectrum of its excitation current with its coupling transfer function. A CPU and heat sink are considered to radiate like a monopole over a ground plane. Similarly, a mutual impedance coupling, or cross-talk, model has its own coupling transfer function. The consequence is that by subtracting the cross-talk coupling transfer function from the signal measured at the coupled conductor, the RF noise signal on a package lid can be determined. To calculate the EMI data, the radiation coupling transfer function is then added to the previously determined RF noise signal. In practice, however, the transfer functions of the devices and structures are not as simple as the theoretical models. Therefore, an empirical relationship between the two methods is used to predict the radiated emission data from the cross-talk data. As long as the insertion of the conductor between the heat sink and package lid does not change the current distribution, amplitude and waveform on the package and the conductor's thickness is small compared to the highest measured frequency's wavelength, then the radiated emission data can be predicted from the measured, cross-talk (or coupled) data. In particular, the mutual impedance coupling method correlates well with the standard far-field EMI measurement method if positive deltas in one method remain positive in the other method and vice versa, and the order of performance remains the same for a variety of packages at all spot frequencies of interest. In general, experiments undertaken by the present inventor, show an empirical correlation between the mutual impedance coupling (MIC) method and the far-field method; this correlation justifies the use of data acquired using the MIC method for qualitative comparison of the EMI performances of various IC packages and systems.

Figure 4:
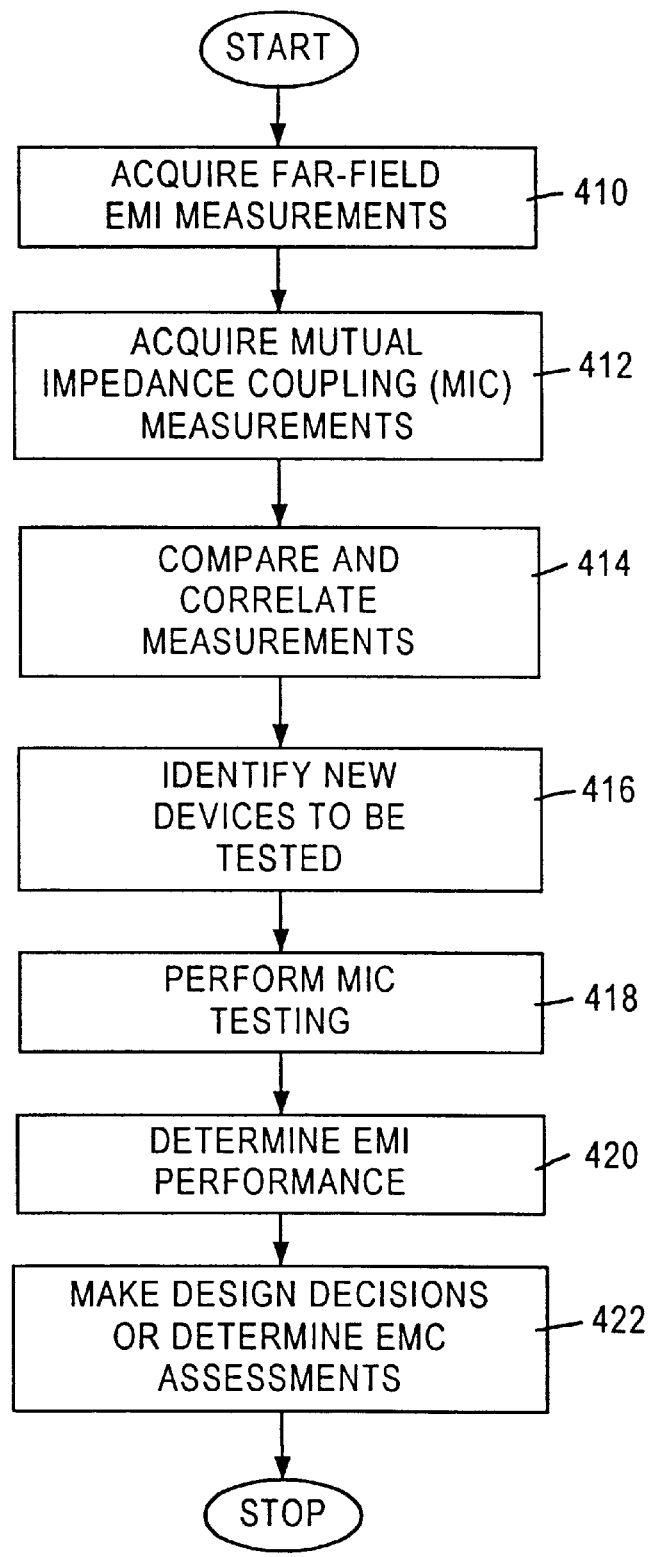
FIG. 4 illustrates a flowchart depicting a method for determining EMI performance of an IC device in accordance with the present invention.

FIG. 4 depicts a flowchart which describes one method of utilizing the measured MIC data, described earlier, to determine far-field EMI performance of a device. In step 410, far-field measurement of EMI data is first collected for a variety of devices to provide a basis by which to analyze MIC measured data. Next, for the same devices, MIC data is collected, in step 412, and then compared to the far-field data to determine, in step 414, the correlation between the two. After this correlation is determined, the expected EMI performance of an untested device can be determined using the novel mutual impedance coupling (MIC) method of the present invention instead of the traditional far-field testing techniques currently used.

When an EMC assessment of a new device, identified in step 416, needs to be performed, or different design options need to be compared, each of the devices being assessed are tested, in step 418, according to the MIC method of the present invention. During this MIC data collection, the test set-up, as depicted in FIGS. 2a–2c, are operated so that RF noise energy is created on the IC lid and consequently coupled to the conductor. The spectrum analyzer is used to measure the resulting voltage levels on the conductor at a variety of frequencies. The voltage potentials observed at different frequencies are then used as indicators to determine, in step 420, the EMI behavior of the devices. This determination is possible because of the correlation between MIC and far-field data discovered in step 414. Thus, MIC testing allows, in step 422, either EMI performance comparisons between different package designs or verification of compliance with EMC standards for a particular package without the need to perform far-field testing.

The present invention addresses the need for EMI measurement methods and arrangements other than the far-field measurement requirements described in EMI regulatory standards. This invention arranges a conductor and IC package such that RF noise energy on the IC's lid is mutually impedance coupled with the conductor. A test set-up is also presented for measuring the voltage levels induced in the conductor. Finally, these voltage levels are then used as indicator of the device's EMI performance. Thus, an assessment of a device's EMC can be accomplished without far-field test measurements being performed.

What is claimed is:

1. A method for determining EMI compliance performance of a system under test comprising the steps:

operating an integrated circuit at an operating speed, wherein the integrated circuit is a substitutable component of the system under test;

measuring a noise voltage of a lid on the integrated circuit, and determining a system level EMI value based on the measured noise voltage.

2. The method of claim 1, wherein the step of measuring the noise voltage includes the steps:

capacitively and inductively coupling a conductor to the lid of the integrated circuit; and measuring a voltage potential difference of the conductor and a ground level, wherein the noise voltage is substantially equal to the voltage potential difference.

3. The method of claim 1, wherein the step of calculating the system level EMI value includes the step:

determining a far-field EMI performance, wherein the system level EMI value is a function of the far-field EMI performance.

4. The method of claim 3 wherein the step of determining the far-field EMI performance includes the step:

determining the far-field EMI performance based on the measured noise voltage of the lid.

5. The method of claim 4, wherein the step of determining the far-field EMI performance includes the steps:

operating a plurality of integrated circuit (IC) devices;

collecting a plurality of far-field EMI measurements for each of the plurality of devices;

collecting a plurality of lid voltage level measurements for each of the plurality of devices;

determining a correlation function between the plurality of far-field EMI measurements and the plurality of lid voltage level measurements; and correlating the measured noise voltage of the lid of the integrated circuit in the system under test to a far-field EMI performance in accordance with the determined correlation function.

6. The method of claim 1, wherein the step of measuring the noise voltage is performed at a plurality of frequencies.

7. The method of claim 6, wherein each of the plurality of frequencies is a harmonic of the operating speed.

8. The method of claim 6, wherein each of the plurality of frequencies is a harmnonic of an I/O speed.

9. The method of claim 1, wherein the integrated circuit is a microprocessor.

10. A method for determining EMI compliance performance of a system under test comprising the steps:
operating an integrated circuit at an operating speed, wherein the integrated circuit is a substitutable component of the system under test;
capacitively and inductively coupling a conductor to the lid of the integrated circuit; and
measuring a voltage potential difference of the conductor and a ground level,
determining a far-field EMI performance of the system under test as a function of the measured voltage potential difference.

11. The method of claim 10, wherein the step of determining a far-field EMI performance of the system under test includes the steps:
operating a plurality of integrated circuit (IC) devices;
collecting a plurality of far-field EMI measurements for each of the plurality of devices;
collecting a plurality of lid voltage level measurements for each of the plurality of devices;
determining a correlation function between the plurality of far-field EMI measurements and the plurality of lid voltage level measurements; and
correlating the measured voltage potential difference to a far-field EMI performance of the system under test in accordance with the determined correlation function.

12. An apparatus for measuring a voltage potential on a lid of an integrated circuit, comprising:
a circuit board which receives an integrated circuit and configured to operate the integrated circuit;
a conductor configured to operatively attach with the integrated circuit such that it is capacitively and inductively coupled to a lid of the integrated circuit when operatively attached, and
a voltage potential output connected to the conductor and a ground level.

13. The apparatus of claim 12, wherein the voltage potential output further comprises a first end electrically attached with the conductor and a ground level and a second end configured to connect with a meter.

14. The apparatus of claim 12, wherein the circuit board is a computer system motherboard.

15. The apparatus of claim 12, wherein the integrated circuit is a microprocessor.

16. The apparatus of claim 12, wherein the conductor is fabricated from copper.

17. The device of claim 12, wherein the thickness of the conductor is smaller than 6 mm.

18. The device of claim 12, wherein the conductor is a rectangle which has substantially the same surface dimensions as the integrated circuit.

19. The device of claim 12, wherein the conductor is directly adjacent to and positioned on top of the integrated circuit package.

20. The device in claim 19, wherein the conductor is shaped to match a shape of the lid.

* * * * *